United States Patent [19]

Streifer

[11] Patent Number: 4,719,630
[45] Date of Patent: Jan. 12, 1988

[54] PHASED ARRAY SEMICONDUCTOR LASERS WITH UNIFORM AND STABLE SUPERMODE

[75] Inventor: William Streifer, Albuquerque, N. Mex.

[73] Assignee: Xerox Corporation, Stamford, Conn.

[21] Appl. No.: 843,485

[22] Filed: Mar. 24, 1986

[51] Int. Cl.[4] .............................................. H01S 3/098
[52] U.S. Cl. ........................................ 372/18; 372/45; 372/46; 372/50
[58] Field of Search .................... 372/50, 18, 45, 46

[56] References Cited

U.S. PATENT DOCUMENTS

| Re. 31,806 | 1/1985 | Scifres et al. | 372/50 |
| 4,594,719 | 6/1986 | Ackley | 372/50 |
| 4,624,000 | 11/1986 | Streifer et al. | 372/45 |

OTHER PUBLICATIONS

W. Streifer et al., "Phase Array Diode Lasers", Laser Focus/Electro-Optics, Jun. 1984, (4 pages).

*Primary Examiner*—Eugene R. LaRoche
*Assistant Examiner*—Michael B. Shingleton
*Attorney, Agent, or Firm*—W. Douglas Carothers, Jr.

[57] ABSTRACT

A phased array semiconductor laser favoring emission in the 1st or Nth supermode over other potential supermodes of the laser comprising a plurality of spatially disposed laser elements formed relative to an active region to provide optical cavities for light wave generation and propagation under lasing conditions and wherein the optical field of laser elements are coupled into the optical cavities of adjacent laser elements to provide a phase locked condition across the array. The position of the outer laser element at each end of the array are spaced closer to adjacent laser element compared to the spacing provided between all the other of laser elements such that the coupling across the array is enhanced to produce at least one supermode with a nearly uniform and fairly rectangular shaped intensity envelope. The optimized optical coupling coefficient between the outer lasing elements and their adjacent laser elements is $\sqrt{2}\,K$, where K is the optical coupling coefficient between the other laser elements. The optical coupling coefficient of $\sqrt{2}\,K$ between these outer lasing elements, however, may be within the range of 80% to 120% of $\sqrt{2}\,K$. The phase of some of the laser elements in the array may be reversed 180°.

6 Claims, 6 Drawing Figures

PHASED ARRAY SEMICONDUCTOR LASERS WITH UNIFORM AND STABLE SUPERMODE

BACKGROUND OF THE INVENTION

This invention relates to phased array semiconductive lasers having multiemission or broad emission capabilities and in particular to phased array lasers having structural design that maintains their operation in a preferred stable supermode pattern.

Phased array semiconductor lasers comprise a plurality of spaced emitters on the same wafer. Examples of such phased array lasers are illustrated in U.S. Pat. No. 4,255,717, now U.S. Pat. No. Re. 31,806 issued Jan. 15, 1985, and in an article of William Streifer et al, entitled "Phased Array Diode Lasers", published in the June 1984 Issue of Laser Focus/Electro-Optics. The emitters of such a laser are confined by the periodically spaced current confinement means, e.g. stripes, for current pumping and establishment of spaced optical filaments in the active region of the structure or by internal waveguide structuring. The current confinement means may be interconnected or the emitters closely spaced to a degree that the optical mode established in each of the filaments couples to neighboring optical filament modes, i.e., the evanescent wave overlaps into adjacent optical lasing cavities. The array of optical fields produced become phased locked, and, if the phase difference between adjacent current confinement means is zero, the lateral radiation pattern in the far field will comprise a single lobe. However, as explained in the above-mentioned article, the phased array laser does not operate to radiate in a single lobe but rather generally operate with radiation into two or more lobes in the far field pattern. The phase relationship between adjacent optical filaments is not under control and the phases themselves adjust in a manner to minimize laser threshold current. In most cases, it appears that lasing is favored in a supermode wherein the optical field between adjacent optical emitters passes through zero. This is because in most real refractive index lasers as well as many gain guided lasers, pumping gain is reduced at locations between the laser filaments or emitters.

Thus, phased array semiconductor lasers with N coupled single mode waveguides may lase in any one of N supermodes or array modes. The term "supermode" has reference to the superposition behavior of a particular field amplitude pattern across the array. Most of these devices tend to lase in the highest order $N^{th}$ supermode, which radiates in a twin lobe far field pattern, whereas the 1st supermode is optimum for applications in that its radiation pattern is a single lobe. Much attention has been devoted in the past few years to fabricating arrays favoring the 1st supermode, by minimizing its threshold relative to the other supermodes. Of greater importance is the problem of stabilizing whichever supermode the array laser selects since one may then design and implement a suitable optical system to utilize the output beam for a particular application, such as an electro-optic line modulator or electro-optic line printer. Although there are exceptions, generally the lowest threshold supermode is not stable with increasing pumping or modulation.

FIG. 1 is a schematic illustration of an array of N coupled emitters wherein, in the particular case shown, $N=10$. An array laser with N coupled emitters has N possible coupled array modes or supermodes. A supermode is a cooperative lasing of the N optical emitters or filaments of the array laser. Since there are N emitters, there are N possible supermodes since all these emitters are optically coupled together.

Each supermode has the property that the 1st and the $N^{th}$ supermode have the same intensity pattern or envelope, the $2^{nd}$ and the $N-1^{th}$ have the same intensity envelope, and, in general, the $i^{th}$ and $N+1-i^{th}$ have the same intensity envelopes.

FIG. 1A shows the supermode field amplitude pattern 10 and overall envelope 12 for a ten emitter or element array laser wherein $i=1$, i.e. the $1^{st}$ or fundamental supermode. Also, illustrated in superimposed relation is the uniform and fairly rectangular shaped charge distribution pattern 14 from current pumping of the laser. The $1^{st}$ or fundamental supermode has all emitters lasing in phase with an amplitude distribution representative of half a sinusoidal cycle. This is the only supermode pattern that radiates in a single central lobe in the far field pattern because all emitters radiate in phase.

FIG. 1B shows the supermode field amplitude pattern 16 and overall envelope 18 for the $N^{th}$ supermode which, for this particular example, is $i=10$. Also, illustrated in superimposed relation is the uniform and fairly rectangular shaped charge distribution pattern 14 from current pumping of the laser. The envelope of the intensity pattern is very similar to the envelope intensity pattern shown for the 1st supermode in FIG. 1A except that alternating emitters have alternating phase, i.e. are out of phase by $\pi$. As a result, this supermode will radiate in two fairly symmetrical lobes in the far field pattern.

There are eight other supermodes for $i=10$. The supermode field amplitude pattern 20 for the 2nd supermode is shown in FIG. 1C wherein the envelope 22 across the array in sinusoidal comprising one positive half cycle and one negative half cycle. The $2^{nd}$ supermode will lase in two closely spaced symmetrical lobes in the far field pattern.

Thus, for a uniformly spaced array of identical emitters, the $1^{st}$ and $N^{th}$ supermode intensity envelopes are half a sinusoidal period, the $2^{nd}$ and the $N-1^{th}$ supermode intensity envelopes are two half sinusoidal periods, etc. The phases of the individual emitters in the $1^{st}$ and $N^{th}$ supermodes differ. Specifically, for the $1^{st}$ supermode, all emitters are in phase and for the $N^{th}$ supermode, the phases alternate between zero and $\pi$. Usually the $1^{st}$ and Nth supermodes have the lowest current thresholds as compared to all other supermodes because their intensity envelopes do not exhibit nulls near the center of the array where the charge density is greater as a result of current spreading and charge diffusion in the active region of the array laser. However, as previously indicated, the $N^{th}$ supermode, which radiates in two lobes, has a lower current threshold of operation than the $1^{st}$ supermode due to the lower gain which naturally occurs between emitting regions.

The primary reason for supermode instability above threshold is the incomplete utilization of the injected charges with increased pumping. Specifically, for a uniformly pumped array, the envelope of the individual modal field amplitudes is sinusoidal for all the supermodes and is a half cycle for the $1^{st}$ and $N^{th}$ supermodes as shown in FIGS. 1A and 1B. An estimation of the sine envelope squared intensity pattern overlap with the fairly rectangular shaped charge distribution pattern 14 indicates that only about 50% of the injected charges will be stimulated to recombine above threshold by any single supermode. Therefore, at best, with a single supermode lasing, the differential efficiency will be reduced by that factor. More critically, the excess charges will provide excess gain, which will encourage other supermodes to lase, thereby producing a deterioration in the far field radiation pattern. For the reasons mentioned above, it is quite important to design an array laser such that at least one supermode will have an equal amplitude envelope over as much of the array as possible, such as either the $1^{st}$ and $N^{th}$ supermodes.

SUMMARY OF THE INVENTION

According to this invention, a phased array semiconductor laser favoring emission in the $1^{st}$ or $N^{th}$ supermode over other potential supermodes of the laser comprises a plurality of spatially disposed laser elements formed relative to an active region to provide optical cavities for light wave generation and propagation under lasing conditions and wherein the optical field of said laser elements are coupled into the optical cavities of adjacent laser elements to provide a phase locked condition across the array. The position of the outer laser element at each end of the array are spaced closer to its adjacent laser element compared to the spacing provided between the other laser elements such that its coupling is enhanced to produce one or more supermodes with a uniform or nearly uniform envelope. It is preferred that the optical coupling coefficient between the outer laser elements and their adjacent laser elements is $\sqrt{2}\,K$ where K is the optical coupling coefficient between the other equally spaced laser elements.

An increase in coupling coefficient between the outermost laser element waveguides at each end of an otherwise uniform array to $\sqrt{2}\,K$, where K is the coupling coefficient between any other waveguides, suffices to cause the envelopes of the $1^{st}$ and $N^{th}$ supermodes to be equal in waveguides 2 through $N-1$. This result, which is based on nearest neighbor coupling theory, when combined with gain enhancement between the waveguides relative to that within the guides themselves, should favor stable operation of the single $1^{st}$ supermode.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1A:
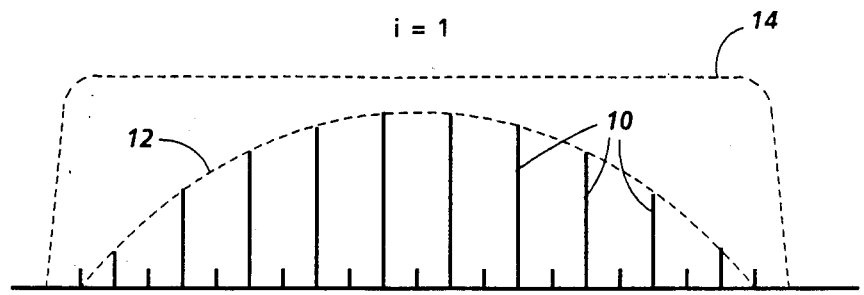
FIG. 1A illustrates the supermode field amplitude pattern and envelope for the fundamental supermode of a ten element array laser.
Figure 1B:
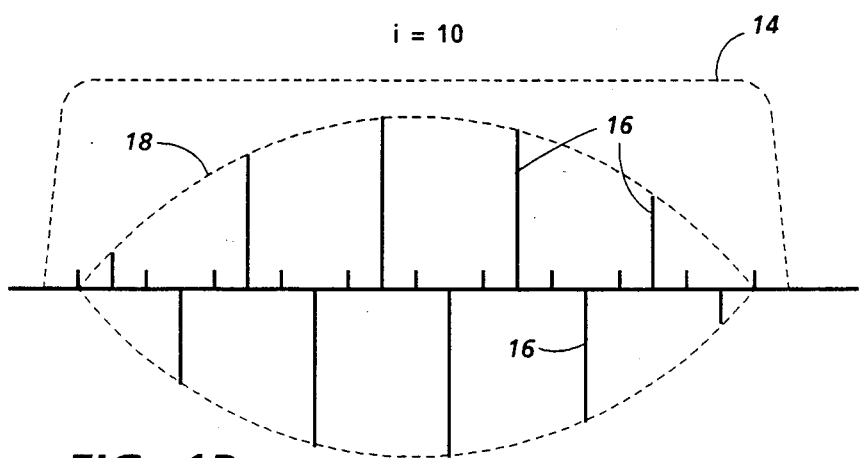
FIG. 1B illustrates the supermode field amplitude pattern and envelope for the $N^{th}$ supermode of a ten element array laser.
Figure 2:
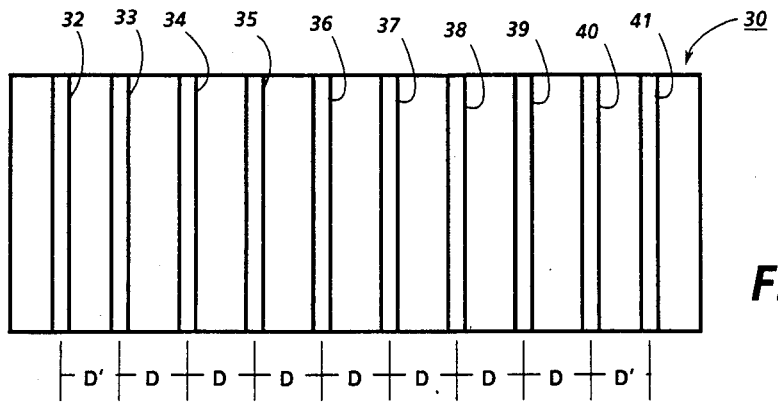
FIG. 2 is a schematic plan view of a multi-emitter array laser (N=10) with laser element spacing comprising this invention.

Reference is now made to FIG. 2 which illustrates the plan view of an array laser 30 having N=10 laser elements 32-41. The general construction and structure of array laser 30 is well known in the art as illustrated in U.S. Pat. No. Re. 31,806 and the above mentioned article of William Streifer et al. Laser elements 33-40 of laser 30 are separated by a space, D. However, the outside laser elements 32 and 41 of array laser 30 are more closely spaced to their adjacent laser elements 33 and 40 as indicated by the spacing D. The closer spacing of outer laser elements 32 and 41 provides for more overlaps of the evanescent wave into the adjacent optical lasing cavities of neighboring laser elements 33 and 40. This closer relationship and increase in the optical field overlap cause an increase in the coupling coefficient and if D is properly chosen, the coupling coefficient is increased by the amount of $\sqrt{2}\,K$, where K is the coupling coefficient between laser elements 33-40. This arrangement supports the supermodes shown in FIGS. 3 and 4 which causes carrier recombination of the excess injected charges in the regions 45 and 47 of these outer laser elements not previous utilized when their spacing with neighboring laser elements was set equal to D. In this connection, compare FIGS. 1A and 1B, respectively, with FIGS. 3 and 4, noting that the ends of the envelopes in FIGS. 3 and 4 have been extended due to injected charge utilizaton in regions 45 and 47.

Figure 1C:
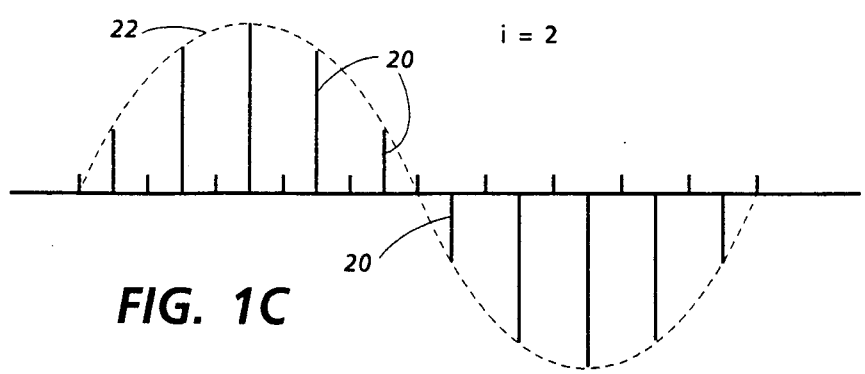
FIG. 1C illustrates the supermode field amplitude pattern and envelope for the second supermode of a ten element array laser.
Figure 3:
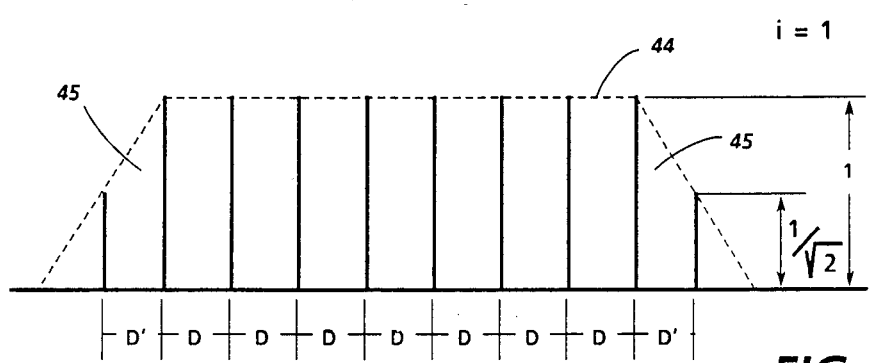
FIG. 3 illustrates the supermode field amplitude pattern and envelope for the $1^{st}$ supermode (N=10) for the array laser of FIG. 2.
Figure 4:
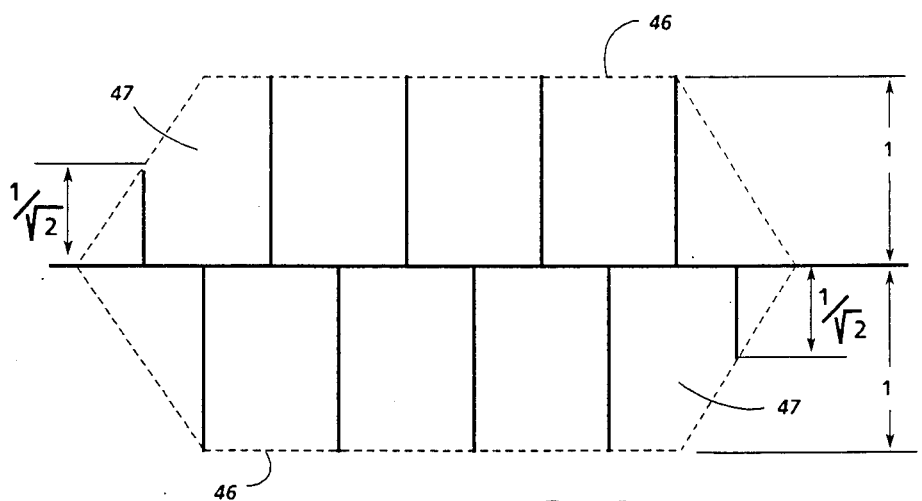
FIG. 4 illustrates the supermode pattern and envelope for the $N^{th}$ supermode (N=10) for the array laser of FIG. 2.

As a result, the envelopes 44 and 46 of modal fill amplitudes respectively for the $1^{st}$ and $N^{th}$ supermodes shown in FIGS. 3 and 4 are almost rectangular in shape and is very similar in shape to the charge distribution pattern 14 in FIG. 1. The fairly uniform utilization of charge injection across the array will bring about stabilizaton of either the $1^{st}$ or $N^{th}$ supermode array in array laser 30, i.e. the supermode preferred will be relatively stable with increasing current pumping above lasing threshold.

It has been determined that an increase in coupling coefficient between outer laser elements 32 and 41 relative to neighboring laser elements 33 and 41 of an otherwise uniformly spaced array of laser elements 33-40 by the amount $\sqrt{2}\,K$ is about optimum. In practice, this may be within 80%-120% of the $\sqrt{2}$ depending upon the particular waveguide geometry of array laser 30. The field strength of laser elements 33-40 will be about the same whereas the field strength of the outer most laser elements 32 and 41 will be $1/\sqrt{2}$ or about 0.707 of the field strength of laser elements 32-41. This suffices to cause the envelopes 44 and 46 of the $1^{st}$ of $N^{th}$ supermodes to be equal in laser elements 33-40. This result, based on the nearest neighbor coupling theory, when combined with gain enhancement between the laser elements relative to that within the laser elements themselves favors stable operation of the $1^{st}$ supermode.

It should be noted that the field intensities of the individual laser elements will be approximately equal in all or most of the waveguides of the laser elements with the exception of the outer most waveguides of the outermost laser elements, which are at an intensity of $1/\sqrt{2}$ compared to the remaining laser elements. Also, all or most all of the laser elements will be in phase with the exception that in some of the laser elements, the phase may be purposely reversed to shape or otherwise control the far field pattern. One example of this is the 180° phase reversal of laser elements 33, 35, 37, 39, and 41 in FIG. 4 to produce an envelope substantially the same as that shown in FIG. 3 for the $1^{st}$ supermode.

Mathematical analysis also supports this result. Consider a phased array laser with N identical single mode parallel laser elements each supporting a mode $E_0(y)$ with propagation constant $\beta$. Laser Elements 2 through $N-1$ are equally spaced with centers separated by D and their interactions are characterized by a coupling coefficient K. The outermost laser elements numbered 1 and N are located in closer proximity, D, to the adjacent laser elements such that the coupling coefficient is enhanced to become $\sqrt{2}K$.

If the individual waveguide modal amplitudes are $U_l(Z)$, $l=1,2\ldots N$ and only nearest neighbor coupling is assumed, the matrix differential equation describing propagation in the array is:

$$\frac{dU}{dZ} = iMU, \quad (1)$$

where $U = \text{col}(U_1, U_2 \ldots U_N)$ and M is the tridiagonal matrix given by:

$$M = \begin{bmatrix} \beta & \sqrt{2}K & 0 & 0 & 0 & 0 & 0 \\ \sqrt{2}K & \beta & K & 0 & 0 & 0 & 0 \\ 0 & K & \beta & K & 0 & 0 & 0 \\ & & & \ddots & & & \\ 0 & 0 & & 0 & K\beta & K & 0 \\ 0 & 0 & & 0 & 0 & K\beta & \sqrt{2}K \\ 0 & 0 & & 0 & 0 & 0 & \sqrt{2}K\beta \end{bmatrix} \quad (2)$$

The matrix M differs from the one describing a uniform array only in the presence of $\sqrt{2}K$ at the extremes of the diagonals.

The eigenfunctions and eigenvalues of Eq. (1) are the supermodes and their propagation constants, respectively. To determine these we write:

$$U^{(\nu)}(z) = U^{(\nu)}(o) e^{i\sigma_\nu z}, \quad (3)$$

substitute in Eq. (1), define $\delta_\nu = \beta - \sigma_\nu$, and solve for $\delta_\nu$ by setting the resultant determinant equal to zero, i.e.

$$\begin{bmatrix} \delta_\nu & \sqrt{2}K & 0 & 0 & 0 & 0 & 0 \\ \sqrt{2}K & \delta_\nu & K & 0 & 0 & 0 & 0 \\ 0 & K & \delta_\nu & K & 0 & 0 & 0 \\ & & & \ddots & & & \\ 0 & 0 & 0 & 0 & K\delta_\nu & K & 0 \\ 0 & 0 & 0 & 0 & 0 & K\delta_\nu & \sqrt{2}K \\ 0 & 0 & 0 & 0 & 0 & 0 & \sqrt{2}K\delta_\nu \end{bmatrix} = 0 \quad (4)$$

After some manipulation we find that:

$$\sigma_\nu = \beta + 2K \cos[\pi(\nu-1)/(N-1)], \nu=1,2\ldots N, \quad (5)$$

which strongly resembles the result for the uniform array. The results differ in that the argument of the cosine in Eq. (5) become 0 and $\pi$, respectively, at the extreme values for the $1^{st}$ supermode and the $N^{th}$ supermode. These solutions do not exist for a uniform array laser.

The supermodes corresponding to the solutions of Eq. (5) are:

$$U_l^{(\nu)} = \begin{cases} 1/\sqrt{2}, & l=1 \\ \cos[(l-1)(\nu-1)\pi/(N-1)], & l=2,3\ldots N-1 \\ (-1)^{\nu-1}/\sqrt{2}, & l=N. \end{cases} \quad (6)$$

In particular, $$U^{(1)} = \text{col}(1/\sqrt{2}, 1, 1, \ldots, 1, 1/\sqrt{2}) \quad (7a)$$

and $$U^{(N)} = \text{col}(1/\sqrt{2}, -1, 1, -1, \ldots, \pm 1, \mp 1/\sqrt{2}). \quad (7b)$$

Thus, for the $1^{st}$ supermode, all but the outermost laser element modes are equal in amplitude and phase and the $1^{st}$ and $N^{th}$ supermodes will more effectively utilize the injected charges both at and above threshold than will the other supermodes of the array, which have unequal amplitudes across the array.

The optical intensity radiation pattern is given by:

$$I(\Theta) = \frac{1}{2} \left| \left\{ \frac{\sin[(N-2)(\eta+\xi)/2]}{\sin[(\eta+\xi)/2]} + (-1)^{\nu-1} \frac{\sin[(N-2)(\eta-\xi)/2]}{\sin[(\eta-\xi)/2]} + (i)^{1-\nu}\sqrt{2} \begin{array}{l} \cos\{[(N-3)/2 + D'/D]\eta\}, \nu\text{-odd} \\ -i\sin\{[(N-3)/2 + D'/D]\eta\} \nu\text{-even} \end{array} \right\} \right|^2, \quad (8)$$

where $\eta = kD \tan \Theta$ and $\xi = (\nu-1)\pi/(N-1)$ and $\nu$ is the supermode. For the $1^{st}$ and $N^{th}$ supermode, the patterns are very similar to those of an array of equal emitters, with a small correction for the two less intense modes in the waveguides of the outermost laser elements displaced by displaced by $D'$.

As a consequence of the unequal modal amplitudes of supermodes 2 through $N-1$, if the $1^{st}$ supermode of Eq. (7a) is favored at threshold over the $N^{th}$ supermode, possibly by virtue of enhanced gain between the laser elements, or by the use of external optical elements, then that supermode will be relatively stable with increased pumping above threshold. Even if the $N^{th}$ supermode has the lowest threshold, it too should remain stable with increased pumping. Moreover, because of the increased overlap between these equal intensity supermodes and the injected charge distribution, the differential efficiency will substantially exceed that of a uniform array operating in a single supermode.

To summarize, an array of identical laser elements can be designed such that the $1^{st}$ and $N^{th}$ supermodes have equal intensities in all but the waveguides in the outermost laser elements. Laser elements 2 through $N-1$ are equally spaced and coupled; laser elements 1 and N are placed more closely to their neighboring elements such their coupling coefficients are greater by a factor of $\sqrt{2}$. For this waveguide geometry, the $1^{st}$ and $N^{th}$ supermodes have uniform field strengths, except in the waveguides of the outermost laser elements 1 and N wherein the field is weaker by $1/\sqrt{2}$. Because these supermodes have maximum overlap with the injected charge distribution, their thresholds are lower than the other supermodes. Furthermore, above threshold, these supermodes more efficiently utilize the injected charges so that other supermodes are not encouraged to begin lasing and the single lasing mode is stable over varied current pumping range.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

I claim:

1. In a phased array semiconductor laser favoring emission in the $1^{st}$ or $N^{th}$ supermode over other potential supermodes of said laser comprising a plurality of spatially disposed laser elements formed relative to an active region to provide optical cavities for light wave generation and propagation under lasing conditions and wherein the optical field of said laser elements are coupled into the optical cavities of adjacent laser elements to provide a phase locked condition across the array, the improvement comprising the center to center spacing of said laser elements is substantially uniform except for the outer laser element at each end of the array which are spaced closer to its adjacent laser element than said uniform spacing such that optical field coupling is enhanced to produce a single supermode with a nearly uniform and fairly rectangular shaped intensity envelope.

2. The phased array semiconductor laser of claim 1 wherein the optical coupling coefficient between said outer lasing elements and their adjacent laser elements is $\sqrt{2}K$ where K is the optical coupling coefficient between said other laser elements.

3. The phased array semiconductor laser of claim 1 wherein the optical coupling coefficient between said outer lasing elements and their adjacent laser elements is within the range of 80% to 120% of $\sqrt{2}K$ where K is the optical coupling coefficient between said other laser elements.

4. The phased array semiconductor laser of claim 1, means to reverse the phase of the output of alternate of said laser elements by 180°.

5. In a phase locked laser array comprising a plurality of spatially disposed parallel laser elements having uniform spacing, D, and sufficiently close in spacing to provide overlapping optical fields so that the modal oscillations of said lasing elements are phase locked to one another, the improvement comprising the outer lasing element at each end of said array being spaced from its adjacent laser element a distance, D', less than said uniform spacing, D, to provide an output intensity envelope substantially as shown in FIG. 3.

6. The phase locked laser array of claim 5 wherein said distance, D', is determined by optimizing the optical coupling coefficient, K', established between said outer laser elements and their adjacent laser elements to be equal to $\sqrt{2}K$, where K is the optical coupling coefficient between said uniformly spaced laser elements.

* * * * *